(12) United States Patent
Zhou

(10) Patent No.: US 11,569,355 B1
(45) Date of Patent: Jan. 31, 2023

(54) METHOD OF MANUFACTURING MEMORY STRUCTURE

(71) Applicant: United Microelectronics Corp., Hsinchu (TW)

(72) Inventor: Zhi-Biao Zhou, Singapore (SG)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 17/470,801

(22) Filed: Sep. 9, 2021

(51) Int. Cl.
*H01L 29/423* (2006.01)
*H01L 29/66* (2006.01)
*H01L 21/28* (2006.01)
*H01L 29/788* (2006.01)

(52) U.S. Cl.
CPC .. *H01L 29/40114* (2019.08); *H01L 29/42328* (2013.01); *H01L 29/66825* (2013.01); *H01L 29/7881* (2013.01)

(58) Field of Classification Search
CPC ......... H01L 29/40114; H01L 29/42328; H01L 29/66825; H01L 29/7881
See application file for complete search history.

(56) References Cited

U.S. PATENT DOCUMENTS

| 8,344,444 | B2 | 1/2013 | Kawashima et al. |
| 9,401,280 | B2 | 7/2016 | Liao et al. |
| 9,431,256 | B2 | 8/2016 | Hsu et al. |
| 9,455,322 | B1 | 9/2016 | Chiu et al. |
| 9,978,761 | B2 * | 5/2018 | Liu .................. H01L 27/11521 |
| 10,020,385 | B2 | 7/2018 | Chiu et al. |
| 10,699,958 | B2 | 6/2020 | Liu et al. |

* cited by examiner

*Primary Examiner* — David Vu
(74) *Attorney, Agent, or Firm* — J.C. Patents

(57) ABSTRACT

A method of manufacturing a memory structure including following steps is provided. Two gate stack structures are formed on a substrate. A conductive material layer is conformally formed on the two gate stack structures. The conductive material layer includes two protrusions located on the two gate stack structures. Hard mask spacers are formed on two sides of each of the two protrusions. A first etching process is performed to remove a portion of the conductive material layer by using the hard mask spacers as a mask. A second etching process is performed to completely remove the hard mask spacers. Then, a third etching process is performed on the conductive material layer to form a first conductive spacer and a second conductive spacer located on one side and the other side of the two gate stack structures and to form a conductive layer located between the two gate stack structures.

20 Claims, 20 Drawing Sheets

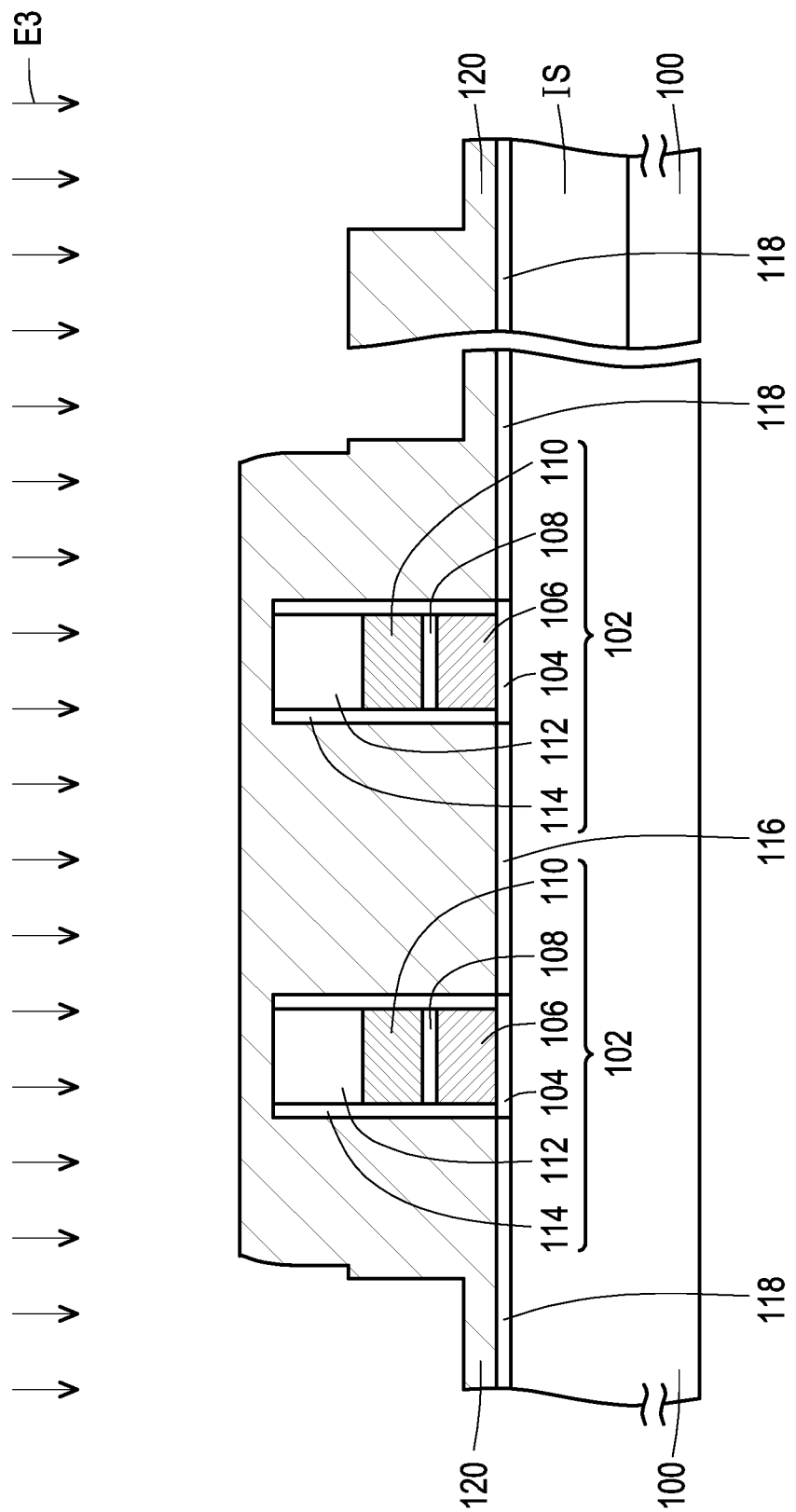

METHOD OF MANUFACTURING MEMORY STRUCTURE

BACKGROUND OF THE INVENTION

Field of the Invention

The invention relates to a method of manufacturing a semiconductor structure, and particularly relates to a method of manufacturing a memory structure.

Description of Related Art

Since the non-volatile memory has the advantage that the stored data will not disappear even after being powered off, many electronic products must require this type of memory to maintain normal operation when the electronic products are turned on. Currently, some types of non-volatile memory have select gates. However, the asymmetric select gates will reduce the electrical performance of the memory device.

SUMMARY OF THE INVENTION

The invention provides a method of manufacturing a memory structure, which can increase the electrical performance of the memory device.

The invention provides a method of manufacturing a memory structure, which includes the following steps. A substrate is provided. Two gate stack structures are formed on the substrate. A conductive material layer is conformally formed on the two gate stack structures. The conductive material layer includes two protrusions located on the two gate stack structures. Hard mask spacers are formed on two sides of each of the two protrusions. A first etching process is performed to remove a portion of the conductive material layer by using the hard mask spacers as a mask. A second etching process is performed to completely remove the hard mask spacers. After completely removing the hard mask spacers, a third etching process is performed on the conductive material layer to form a first conductive spacer, a second conductive spacer, and a conductive layer. The first conductive spacer and the second conductive spacer are located on one side and the other side of the two gate stack structures. The conductive layer is located between the two gate stack structures.

According to an embodiment of the invention, in the method of manufacturing the memory structure, the hard mask spacers between the two protrusions may be connected to each other.

According to an embodiment of the invention, in the method of manufacturing the memory structure, the first conductive spacer and the second conductive spacer may be separated from the conductive layer.

According to an embodiment of the invention, in the method of manufacturing the memory structure, the method of forming the hard mask spacers may include the following steps. A hard mask material layer is conformally formed on the conductive material layer. A fourth etching process is performed on the hard mask material layer.

According to an embodiment of the invention, in the method of manufacturing the memory structure, the fourth etching process is, for example, a dry etching process.

According to an embodiment of the invention, in the method of manufacturing the memory structure, the method of forming hard mask spacers may further include the following steps. Before performing the fourth etching process, a patterned photoresist layer is formed on the hard mask material layer. A first portion of the patterned photoresist layer may cover a portion of the hard mask material layer between the two gate stack structures.

According to an embodiment of the invention, in the method of manufacturing the memory structure, the method of forming hard mask spacers may further include the following step. Before completely removing the hard mask spacers, the patterned photoresist layer is removed.

According to an embodiment of the invention, in the method of manufacturing the memory structure, a second portion of the patterned photoresist layer may cover a portion of the hard mask material layer outside the two gate stack structures.

According to an embodiment of the invention, in the method of manufacturing the memory structure, after performing the third etching process on the conductive material layer, a portion of the conductive material layer below the second portion of the patterned photoresist layer may be remained to form a pad. The pad may be connected to the second conductive spacer.

According to an embodiment of the invention, the method of manufacturing the memory structure may further include the following step. After performing the first etching process and before completely removing the hard mask spacers, a shape adjustment process is performed. The shape adjustment process may include the following steps. A fourth etching process is performed on the hard mask spacers. After performing the fourth etching process, a fifth etching process is performed on the conductive material layer by using the hard mask spacers as a mask.

According to an embodiment of the invention, in the method of manufacturing the memory structure, the first etching process is, for example, a dry etching process.

According to an embodiment of the invention, in the method of manufacturing the memory structure, the second etching process is, for example, a wet etching process, a dry etching process, or a combination thereof.

According to an embodiment of the invention, in the method of manufacturing the memory structure, the third etching process is, for example, a dry etching process.

According to an embodiment of the invention, in the method of manufacturing the memory structure, the conductive layer may extend from a sidewall of one of the two gate stack structures to a sidewall of the other of the two gate stack structures.

According to an embodiment of the invention, in the method of manufacturing the memory structure, the conductive layer may include a center portion and two side portions. The two side portions are connected to two sides of the center portion. The height of the center portion may be lower than the heights of the two side portions.

According to an embodiment of the invention, in the method of manufacturing the memory structure, each of the two gate stack structures may include a first dielectric layer, a charge storage layer, a second dielectric layer, a gate, a hard mask layer, and a dielectric spacer. The first dielectric layer is located on the substrate. The charge storage layer is located on the first dielectric layer. The second dielectric layer is located on the charge storage layer. The gate is located on the second dielectric layer. The hard mask layer is located on the gate. The dielectric spacer is located on the sidewall of the gate stack structure.

According to an embodiment of the invention, in the method of manufacturing the memory structure, one end of one of the two gate stack structures may be connected to one end of the other of the two gate stack structures to form a U-shaped gate stack structure.

According to an embodiment of the invention, in the method of manufacturing the memory structure, one end of the first conductive spacer may be connected to one end of the second conductive spacer to form a U-shaped conductive spacer.

According to an embodiment of the invention, in the method of manufacturing the memory structure, two ends of one of the two gate stack structures may be connected to two ends of the other of the two gate stack structures to form a ring-shaped gate stack structure.

According to an embodiment of the invention, in the method of manufacturing the memory structure, one end of the first conductive spacer may be connected to one end of the second conductive spacer to form a U-shaped conductive spacer, or two ends of the first conductive spacer may be connected to two ends of the second conductive spacer to form a ring-shaped conductive spacer.

Based on the above description, in the method of manufacturing the memory structure according to the invention, the first conductive spacer, the second conductive spacer, and the conductive layer can be formed by the self-aligned method, wherein the first conductive spacer and the second conductive spacer are located on one side and the other side of the two gate stack structures, and the conductive layer is located between the two gate stack structures. Since the first conductive spacer and the second conductive spacer are formed by the self-aligned method, the size and shape of the first conductive spacer and the size and shape of the second conductive spacer can be more symmetrical, thereby improving the electrical performance of the memory device. In addition, the first etching process is performed to remove a portion of the conductive material layer by using the hard mask spacers as a mask, so that the first conductive spacer and the second conductive spacer can have a better shape, thereby improving the electrical performance of the memory device. Furthermore, since the first conductive spacer and the second conductive spacer are formed by the self-aligned method, the number of photomasks can be reduced, thereby reducing the manufacturing cost.

In order to make the aforementioned and other objects, features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 8A to FIG. 8G are cross-sectional views illustrating a method manufacturing of a memory structure according to another embodiment of the invention.

DESCRIPTION OF THE EMBODIMENTS

Figure 1A:
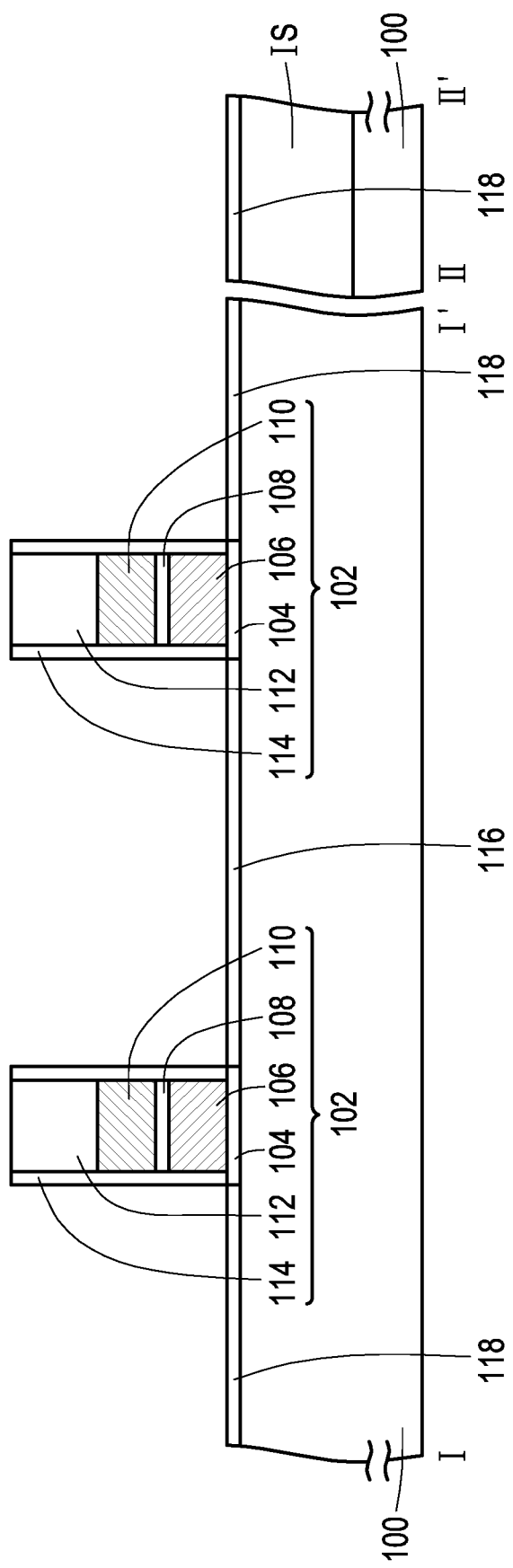
FIG. 1A to FIG. 1G are cross-sectional views illustrating a method manufacturing of a memory structure according to an embodiment of the invention.
Figure 1B:
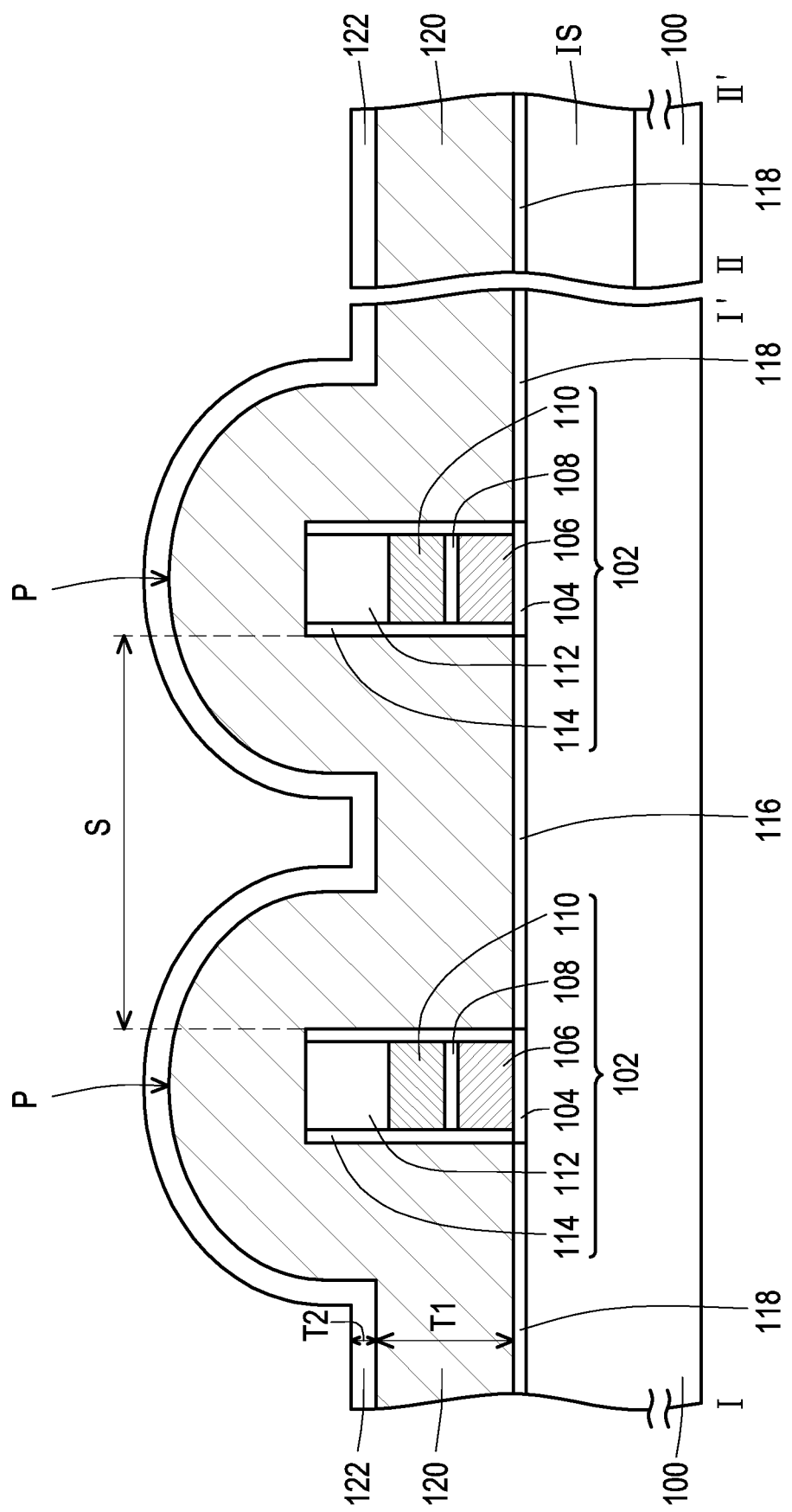
Figure 1C:
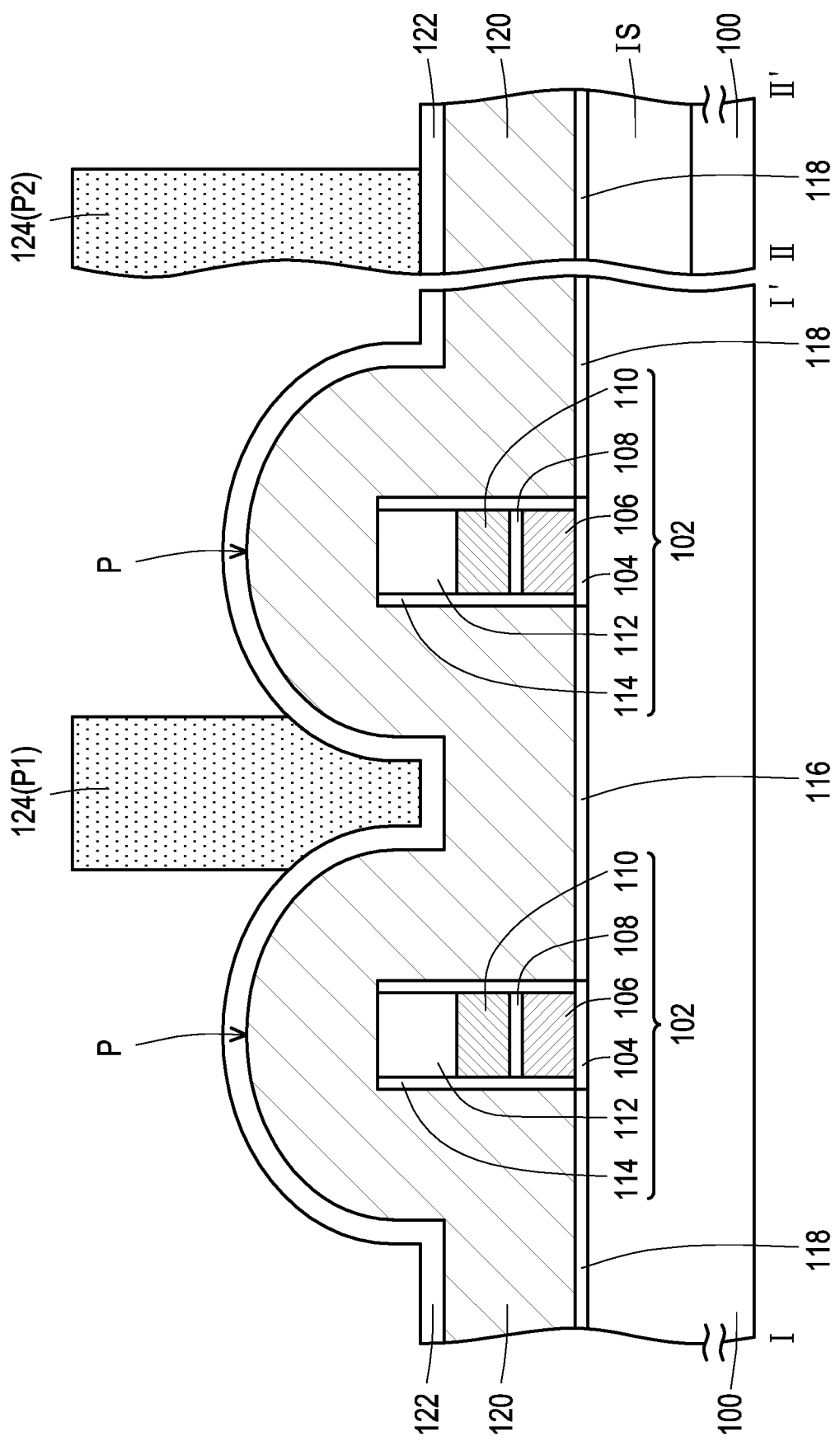
Figure 1D:
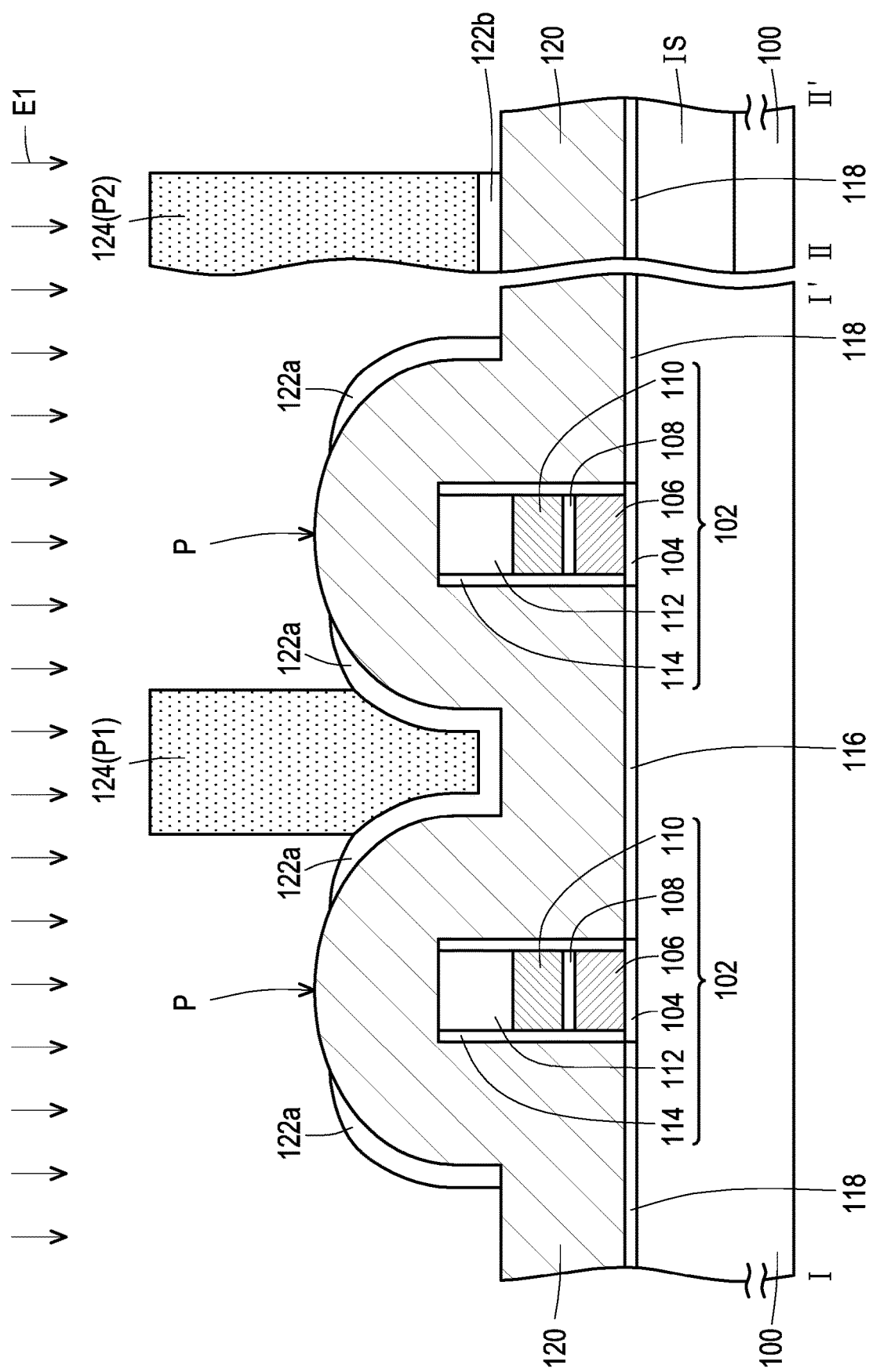
Figure 1E:
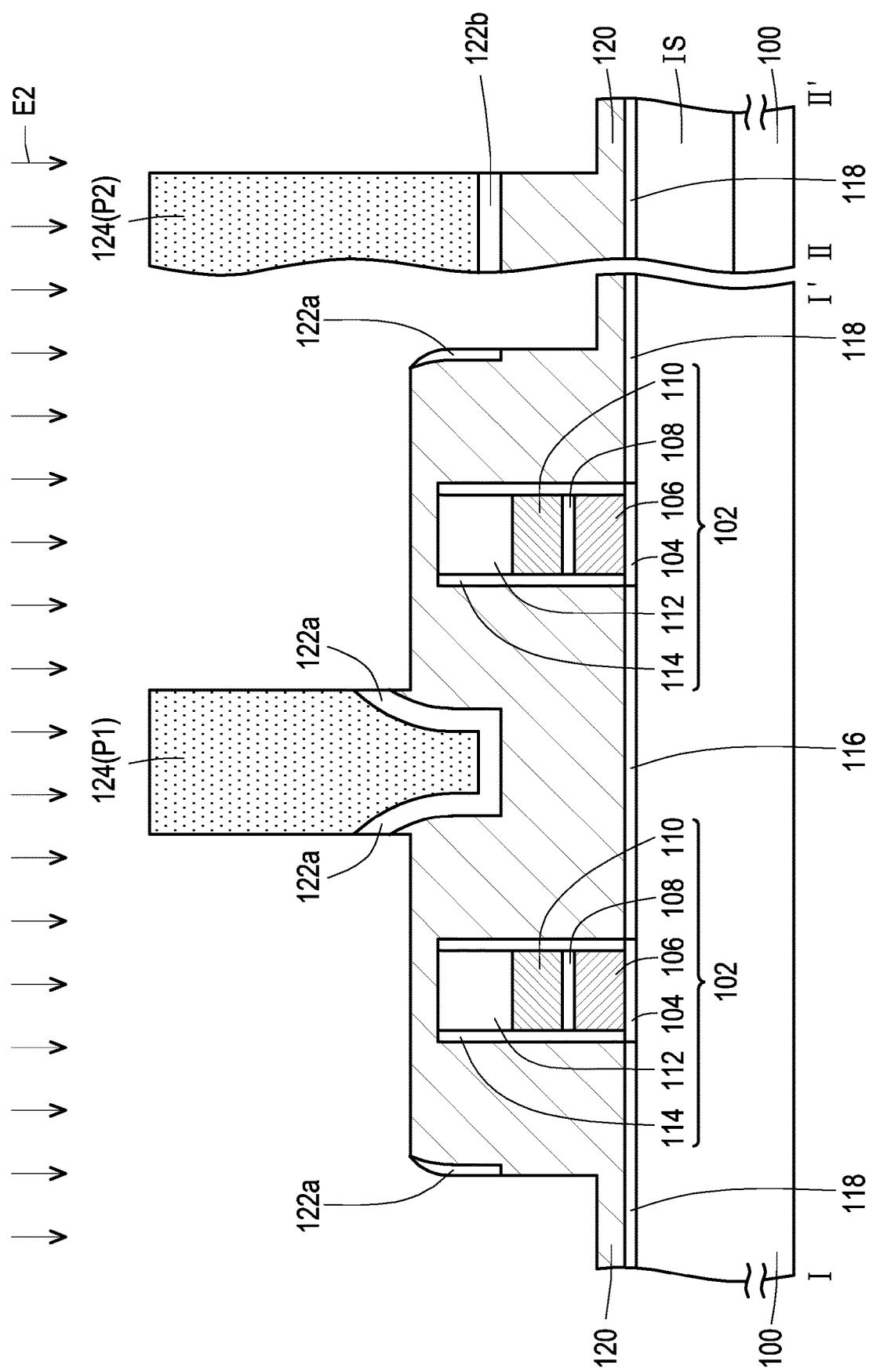
Figure 1F:
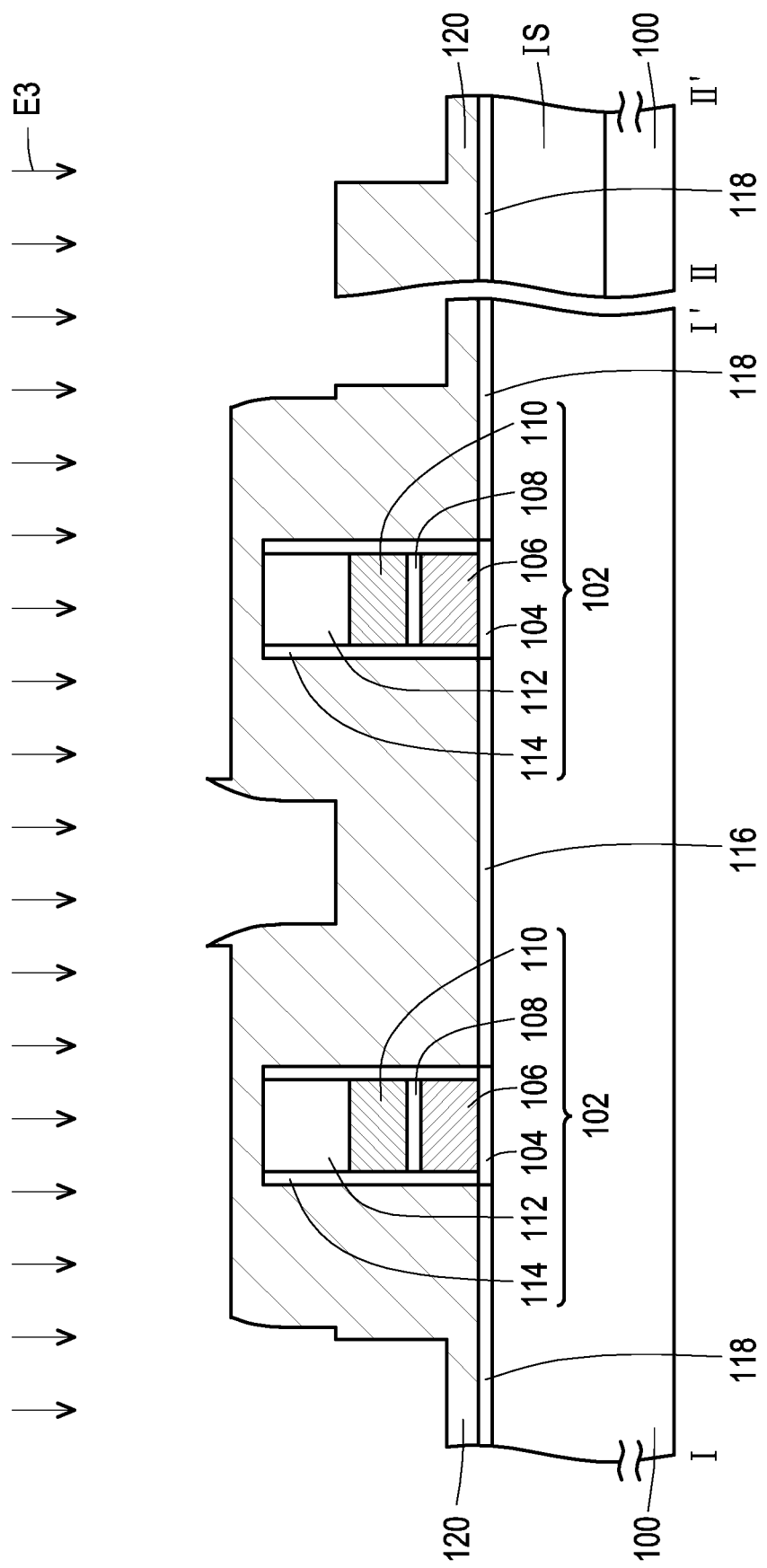
Figure 1G:
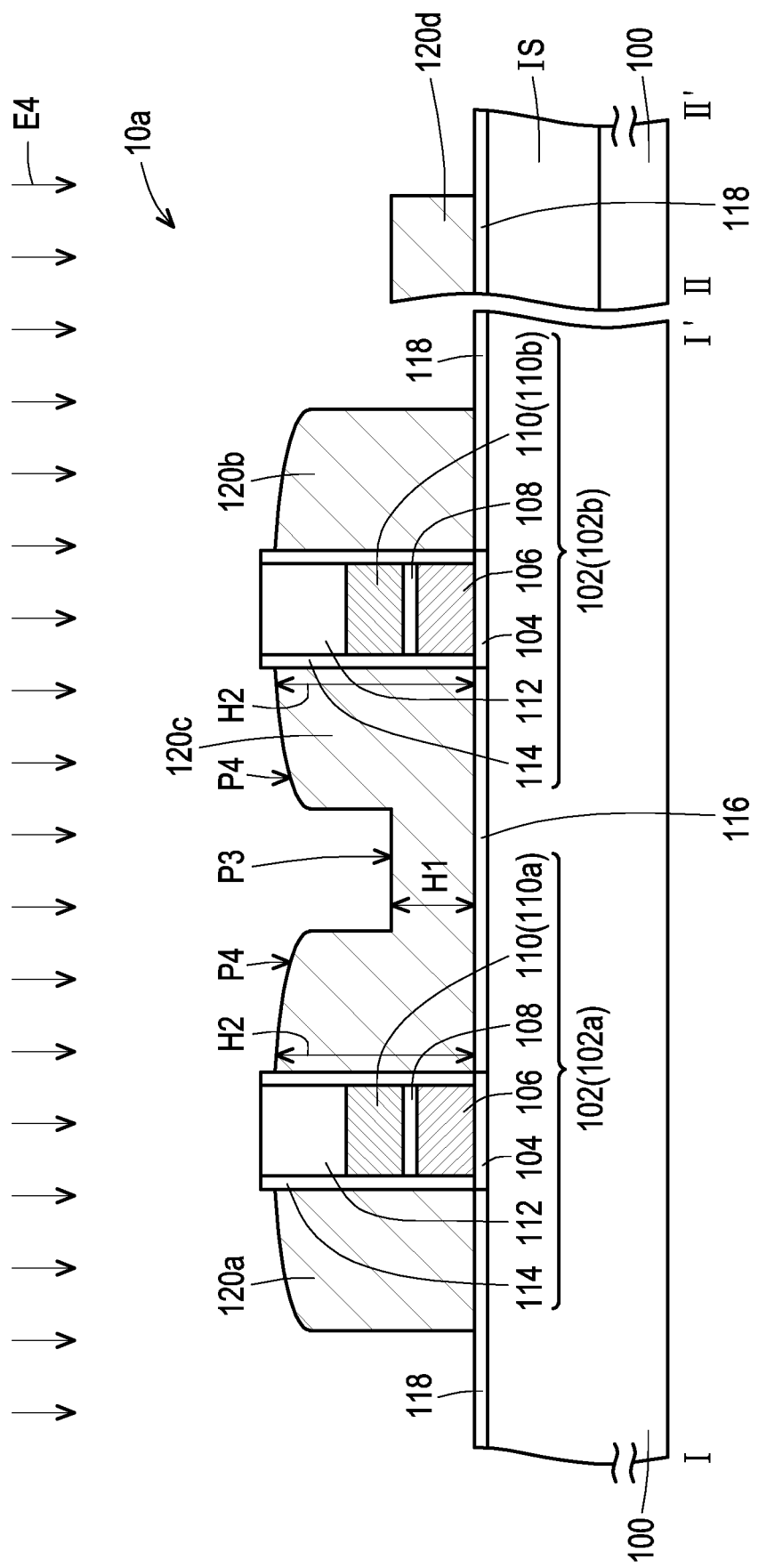

FIG. 1A to FIG. 1G are cross-sectional views illustrating a method manufacturing of a memory structure according to an embodiment of the invention. FIG. 2 to FIG. 7 are top views illustrating a layout of a memory structure according to some embodiments of the invention. FIG. 1A to FIG. 1G are cross-sectional views taken along section line I-I' and section line II-II' in FIG. 2 to FIG. 7. In FIG. 2 to FIG. 7, some of the components in FIG. 1G are omitted to clearly describe the configuration relationship between the components in FIG. 2 to FIG. 7. In addition, the features in the cross-sectional views and the features in the top views are not drawn to the same scale. Moreover, the drawings are for illustrative purposes only and are not drawn to the original dimensions.

Referring to FIG. 1A, a substrate 100 is provided. The substrate 100 may be a semiconductor substrate, such as a silicon substrate. Furthermore, an isolation structure IS may be formed in the substrate 100. The isolation structure IS is, for example, a shallow trench isolation (STI) structure. The material of the isolation structure IS is, for example, silicon oxide.

Two gate stack structures 102 are formed on the substrate 100. Each of the two gate stack structures 102 may include a dielectric layer 104, a charge storage layer 106, a dielectric layer 108, a gate 110, a hard mask layer 112, and a dielectric spacer 114. The dielectric layer 104 is located on the substrate 100. The material of the dielectric layer 104 is, for example, silicon oxide. The charge storage layer 106 is located on the dielectric layer 104. In some embodiments, the charge storage layer 106 may be a floating gate. The material of the charge storage layer 106 is, for example, doped polysilicon, undoped polysilicon, or a combination thereof. The dielectric layer 108 is located on the charge storage layer 106. The dielectric layer 108 may be a single-layer structure or a multilayer structure. The material of the spacer 118 is, for example, silicon oxide, silicon nitride, or a combination thereof. The gate 110 is located on the dielectric layer 108. The gate 110 may be used as a control gate. The material of the gate 110 is, for example, doped polysilicon. The hard mask layer 112 is located on the gate 110. The material of the hard mask layer 112 is, for example, silicon nitride. The dielectric spacer 114 is located on the sidewall of the gate stack structure 102. The dielectric spacer 114 may be a single-layer structure or a multilayer structure. The material of the dielectric spacer 114 is, for example, silicon oxide, silicon nitride, or a combination thereof.

Furthermore, a dielectric layer 116 may be formed on the substrate 100 between the two gate stack structures 102. The material of the dielectric layer 116 is, for example, silicon oxide. Moreover, a dielectric layer 118 may be formed on the substrate 100 outside the two gate stack structures 102. The material of the dielectric layer 118 is, for example, silicon oxide.

Referring to FIG. 1B, a conductive material layer 120 is conformally formed on the two gate stack structures 102. The conductive material layer 120 includes two protrusions P located on the two gate stack structures 102. The material of the conductive material layer 120 is, for example, doped polysilicon. The method of forming the conductive material layer 120 is, for example, a chemical vapor deposition (CVD) method. In some embodiment, the thickness T1 of the conductive material layer 120 may be less than half of the spacing S between the two gate stack structures 102, but the invention is not limited thereto. In some embodiment, the two protrusions P may be separated from each other, but the invention is not limited thereto.

A hard mask material layer 122 may be conformally formed on the conductive material layer 120. In some embodiments, the thickness T2 of the hard mask material layer 122 may be 20% to 50% of the thickness T1 of the conductive material layer 120. The material of the hard mask material layer 122 is, for example, silicon oxide or silicon nitride. The method of forming the hard mask material layer 122 is, for example, a CVD method.

Referring to FIG. 1C, a patterned photoresist layer 124 may be formed on the hard mask material layer 122. In some embodiments, a portion P1 of the patterned photoresist layer 124 may cover a portion of the hard mask material layer 122 between the two gate stack structures 102. In some embodiments, a portion P2 of the patterned photoresist layer 124 may cover a portion of the hard mask material layer 122 outside the two gate stack structures 102.

Referring to FIG. 1D, an etching process E1 may be performed on the hard mask material layer 122. In some embodiment, the etching process E1 may be performed on the hard mask material layer 122 by using patterned photoresist layer 124 as a mask. Therefore, hard mask spacers 122a are formed on two sides of each of the two protrusions P, and a hard mask layer 122b may be formed on the conductive material layer 120 outside the two gate stack structures 102. The hard mask spacers 122a between the two protrusions P may be connected to each other. The etching process E1 is, for example, a dry etching process.

Referring to FIG. 1E, an etching process E2 is performed to remove a portion of the conductive material layer 120 by using the hard mask spacers 122a, and the patterned photoresist layer 124, and the hard mask layer 122b as a mask. During the etching process E2, the hard mask spacers 122a can protect a portion of the conductive material layer 120 located below the hard mask spacers 122a, and a portion of the hard mask spacers 122a may be consumed and removed. The etching process E2 is, for example, a dry etching process.

In some embodiments, after performing the etching process E2, a shape adjustment process may be performed. The shape adjustment process may include the following steps. An etching process (e.g., dry etching process) is performed on the hard mask spacers 122a. After performing the etching process performed on the hard mask spacers 122a, an etching process (e.g., dry etching process) is performed on the conductive material layer 120 by using the hard mask spacers 122a as a mask. In some embodiments, the shape adjustment process may be performed one or more times. In other embodiments, the shape adjustment process may be omitted.

Referring to FIG. 1F, the patterned photoresist layer 124 may be removed. The method of removing the patterned photoresist layer 124 is, for example, a dry stripping method or a wet stripping method.

An etching process E3 is performed to completely remove the hard mask spacers 122a. In addition, the hard mask layer 122b may be completely removed by the etching process E3. The etching process E3 is, for example, a wet etching process, a dry etching process, or a combination thereof.

In some embodiments, the patterned photoresist layer 124 may be removed after performing the shape adjustment process, but the invention is not limited thereto. As long as the patterned photoresist layer 124 is removed after forming the hard mask spacers 122a and the hard mask layer 122b and before completely removing the hard mask spacers 122a and the hard mask layer 122b, it falls within the scope of the invention.

Referring to FIG. 1G, after completely removing the hard mask spacers 122a, an etching process E4 is performed on the conductive material layer 120 to form a conductive spacer 120a, a conductive spacer 120b, and a conductive layer 120c. The conductive spacer 120a and the conductive spacer 120b are located on one side and the other side of the two gate stack structures 102. The conductive spacer 120a and the conductive spacer 120b may be respectively used as a select gate or a word line. The conductive layer 120c is located between the two gate stack structures 102. The conductive layer 120c may be used as an erase gate. The conductive layer 120c may extend from a sidewall of one (e.g., gate stack structures 102a) of the two gate stack structures 102 to a sidewall of the other (e.g., gate stack structures 102b) of the two gate stack structures 102. The conductive layer 120c may include a center portion P3 and two side portions P4. The two side portions P4 are connected to two sides of the center portion P3. The height H1 of the center portion P3 may be lower than the heights H2 of the two side portions P4. Furthermore, after performing the etching process E4 on the conductive material layer 120, a portion of the conductive material layer 120 below the portion P2 (FIG. 1C) of the patterned photoresist layer 124 (FIG. 1C) may be remained to form a pad 120d. The pad 120d may be connected to the conductive spacer 120b (FIG. 2 to FIG. 7). Furthermore, the pad 120d may be located over the isolation structure IS. The etching process E4 is, for example, a dry etching process.

Figure 2:
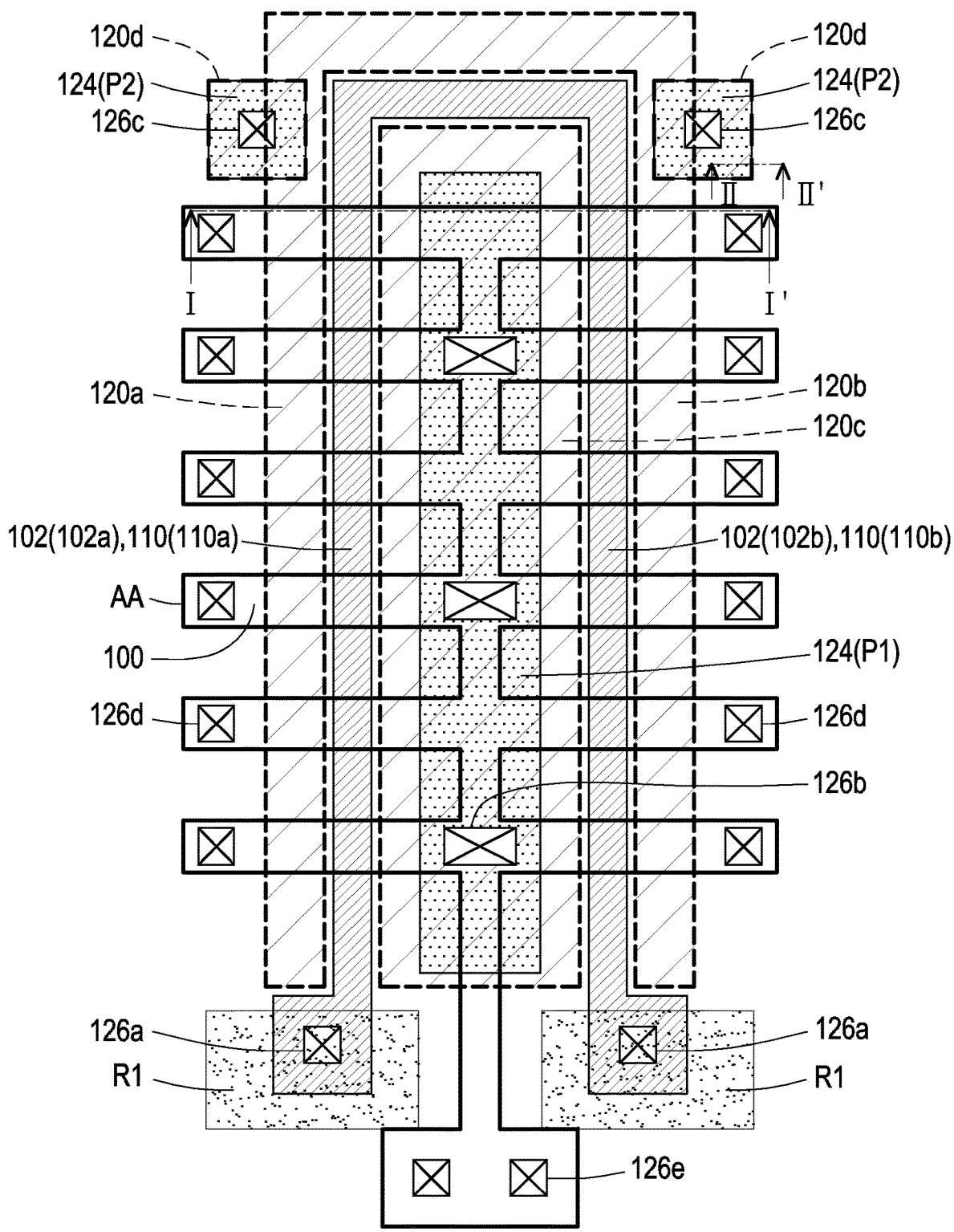
FIG. 2 to FIG. 7 are top views illustrating a layout of a memory structure according to some embodiments of the invention.
Figure 3:
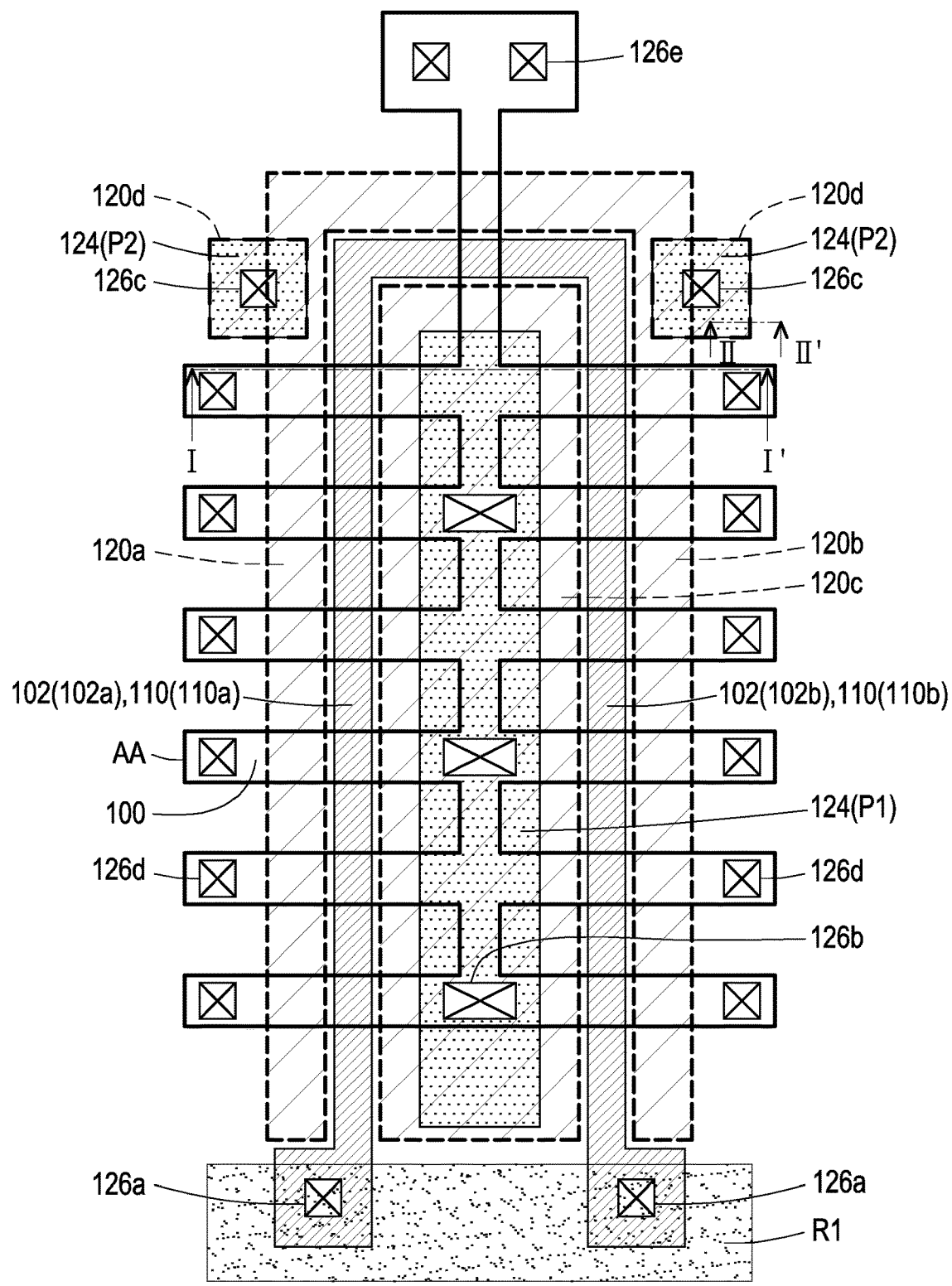

In some embodiments, referring to FIG. 1G, FIG. 2, and FIG. 3, one end of one (e.g., gate stack structures 102a) of the two gate stack structures 102 may be connected to one end of the other (e.g., gate stack structures 102b) of the two gate stack structures 102 to form a U-shaped gate stack structure 102U (FIG. 2 and FIG. 3). Referring to FIG. 1G, FIG. 2, and FIG. 3, one end of one (e.g., gate 110a) of the two gates 110 may be connected to one end of the other (e.g., gate 110b) of the two gates 110 to form a U-shaped gate 110U (FIG. 2 and FIG. 3). In the embodiments of FIG. 2 and FIG. 3, after performing the etching process E4, the conductive spacer 120a, the conductive spacer 120b, and the conductive layer 120c located in the region R1 may be removed by a patterning process, so that the conductive spacer 120a and the conductive spacer 120b may be separated from the conductive layer 120c. Moreover, in FIG. 2 and FIG. 3, one end of the conductive spacer 120a may be connected to one end of the conductive spacer 120b to form a U-shaped conductive spacer 120U.

Figure 4:
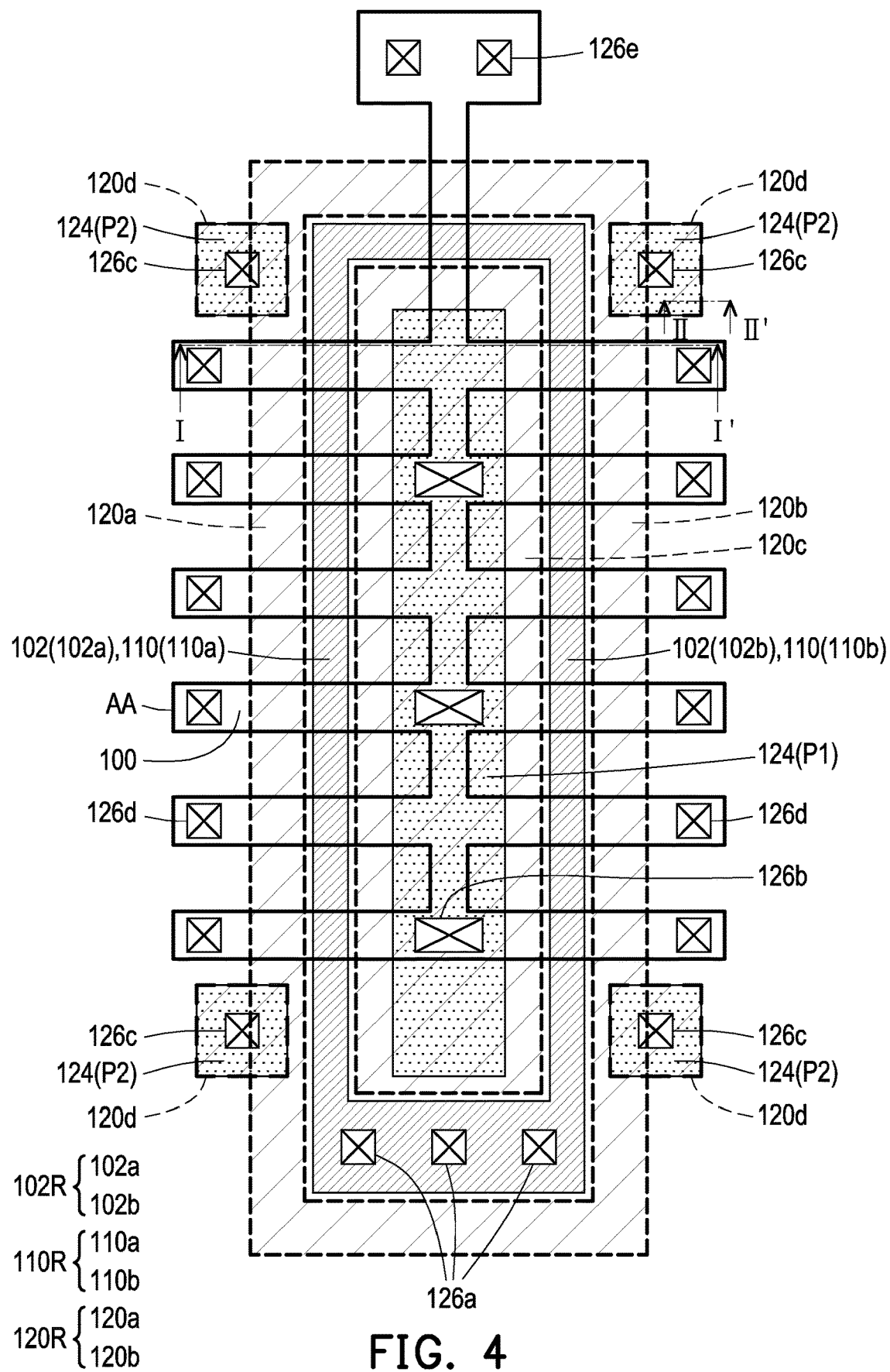
Figure 5:
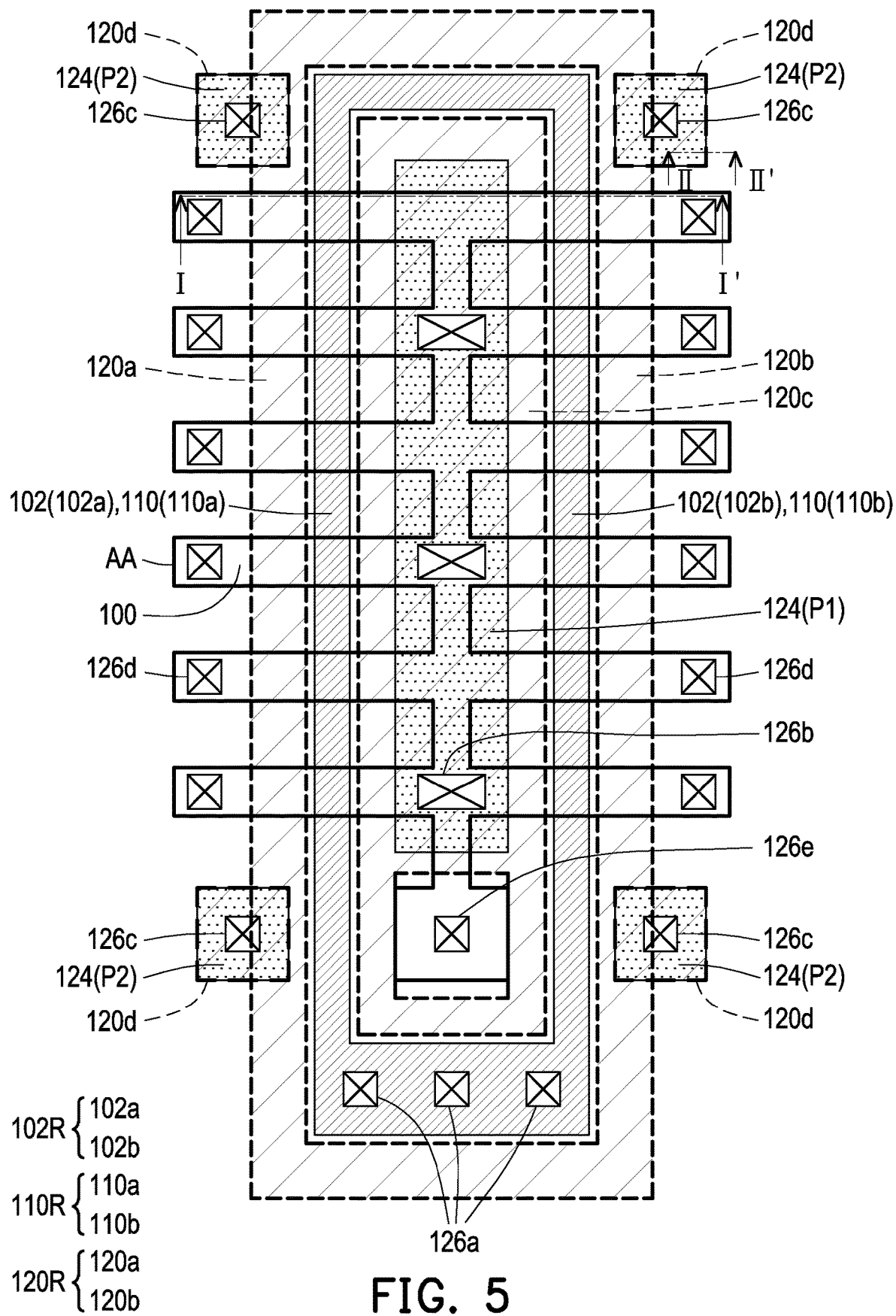

In some embodiments, referring to FIG. 1G, FIG. 4, and FIG. 5, two ends of one (e.g., gate stack structures 102a) of the two gate stack structures 102 may be connected to two ends of the other (e.g., gate stack structures 102b) of the two gate stack structures 102 to form a ring-shaped gate stack structure 102R (FIG. 4 and FIG. 5). Referring to FIG. 1G, FIG. 4, and FIG. 5, two ends of one (e.g., gate 110a) of the two gates 110 may be connected to two ends of the other (e.g., gate 110b) of the two gates 110 to form a ring-shaped gate 110R (FIG. 4 and FIG. 5). In the embodiments of FIG. 4 and FIG. 5, after performing the etching process E4, the conductive spacer 120a and the conductive spacer 120b may be separated from the conductive layer 120c. Moreover, in FIG. 4 and FIG. 5, two ends of the conductive spacer 120a may be connected to two ends of the conductive spacer 120b to form a ring-shaped conductive spacer 120R.

Figure 6:
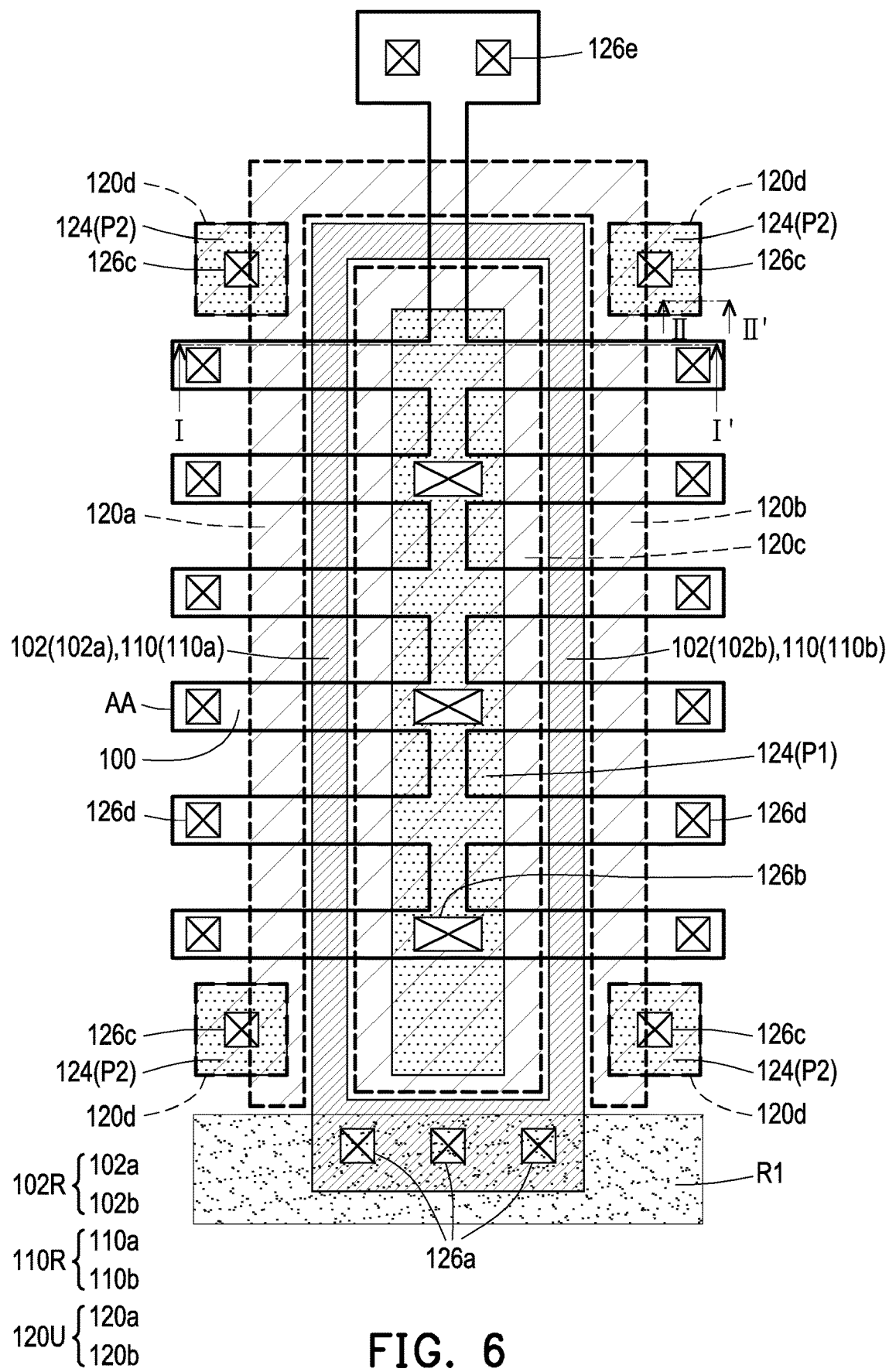
Figure 7:
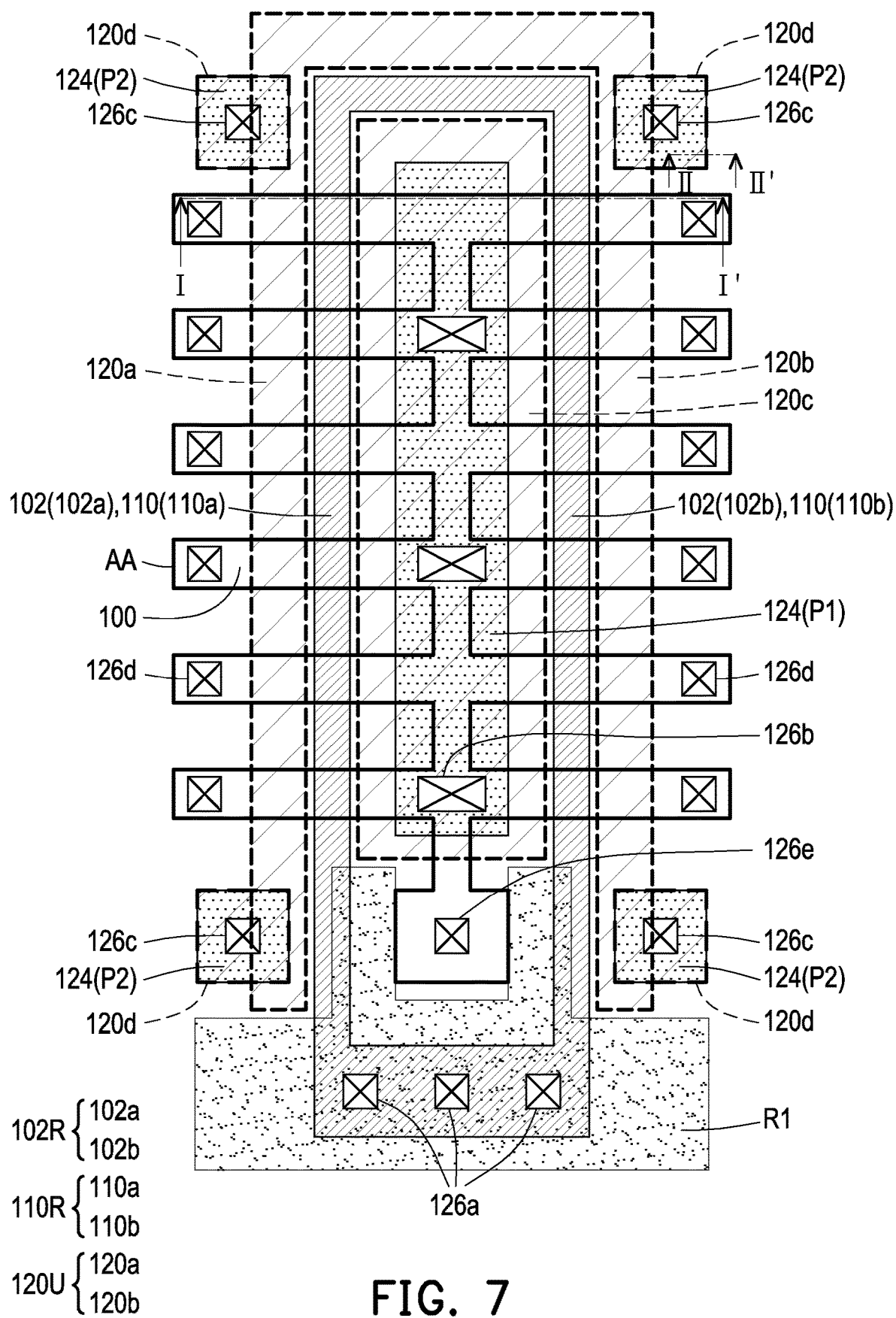

In some embodiments, referring to FIG. 1G, FIG. 6, and FIG. 7, two ends of one (e.g., gate stack structures 102a) of the two gate stack structures 102 may be connected to two ends of the other (e.g., gate stack structures 102b) of the two gate stack structures 102 to form a ring-shaped gate stack structure 102R (FIG. 6 and FIG. 7). Referring to FIG. 1G, FIG. 6, and FIG. 7, two ends of one (e.g., gate 110a) of the two gates 110 may be connected to two ends of the other (e.g., gate 110b) of the two gates 110 to form a ring-shaped gate 110R (FIG. 6 and FIG. 7). In the embodiments of FIG. 6 and FIG. 7, after performing the etching process E4, the conductive spacer 120a and the conductive spacer 120b may be separated from the conductive layer 120c. In the embodiments of FIG. 6, after performing the etching process E4, the conductive spacer 120a and the conductive spacer 120b located in the region R1 may be removed by a patterning process, so that one end of the conductive spacer 120a may be connected to one end of the conductive spacer 120b to form a U-shaped conductive spacer 120U. In the embodiments of FIG. 7, after performing the etching process E4, the conductive spacer 120a, the conductive spacer 120b, and the conductive layer 120c located in the region R1 may be removed by a patterning process, so that one end of the conductive spacer 120a may be connected to one end of the conductive spacer 120b to form a U-shaped conductive spacer 120U.

In addition, the required doped regions (e.g., drain region or source line region) (not shown) well known to one of ordinary skill in the art may be formed in the substrate, and the description thereof is omitted here.

Referring to FIG. 2 to FIG. 7, the contact 126a is electrically connected to the U-shaped gate 110U (e.g., control gate) (FIG. 2 and FIG. 3) or the ring-shaped gate 110R (e.g., control gate) (FIG. 4 to FIG. 7), the contact 126b is electrically connected to the conductive layer 120c (e.g., erase gate), the contact 126c is electrically connected to the pad 120d, the contact 126d is electrically connected to the doped region (e.g., drain region) in the active region AA, and the contact 126e is electrically connected to the doped region (e.g., source line region) in the active region AA.

Based on the above embodiments, in the method of manufacturing the memory structure 10a (FIG. 1G), the conductive spacer 120a, the conductive spacer 120b, and the conductive layer 120c can be formed by the self-aligned method, wherein the conductive spacer 120a and the conductive spacer 120b are located on one side and the other side of the two gate stack structures 102, and the conductive layer 120c is located between the two gate stack structures 102. Since the conductive spacer 120a and the conductive spacer 120b are formed by the self-aligned method, the size and shape of the conductive spacer 120a and the size and shape of the conductive spacer 120b can be more symmetrical, thereby improving the electrical performance of the memory device. In addition, the etching process E2 is performed to remove a portion of the conductive material layer 120 by using the hard mask spacers 122a as a mask, so that the conductive spacer 120a and the conductive spacer 120b can have a better shape, thereby improving the electrical performance of the memory device. For example, the shapes of the conductive spacer 120a and the conductive spacer 120b can be similar to rectangle or trapezoid, so that the conductive spacer 120a and the conductive spacer 120b can have more uniform thickness. Furthermore, since the conductive spacer 120a and the conductive spacer 120b are formed by the self-aligned method, the number of photomasks can be reduced, thereby reducing the manufacturing cost. In some embodiments, the memory structure 10a may be a non-volatile memory such as flash memory.

FIG. 8A to FIG. 8G are cross-sectional views illustrating a method manufacturing of a memory structure according to another embodiment of the invention.

Figure 8A:
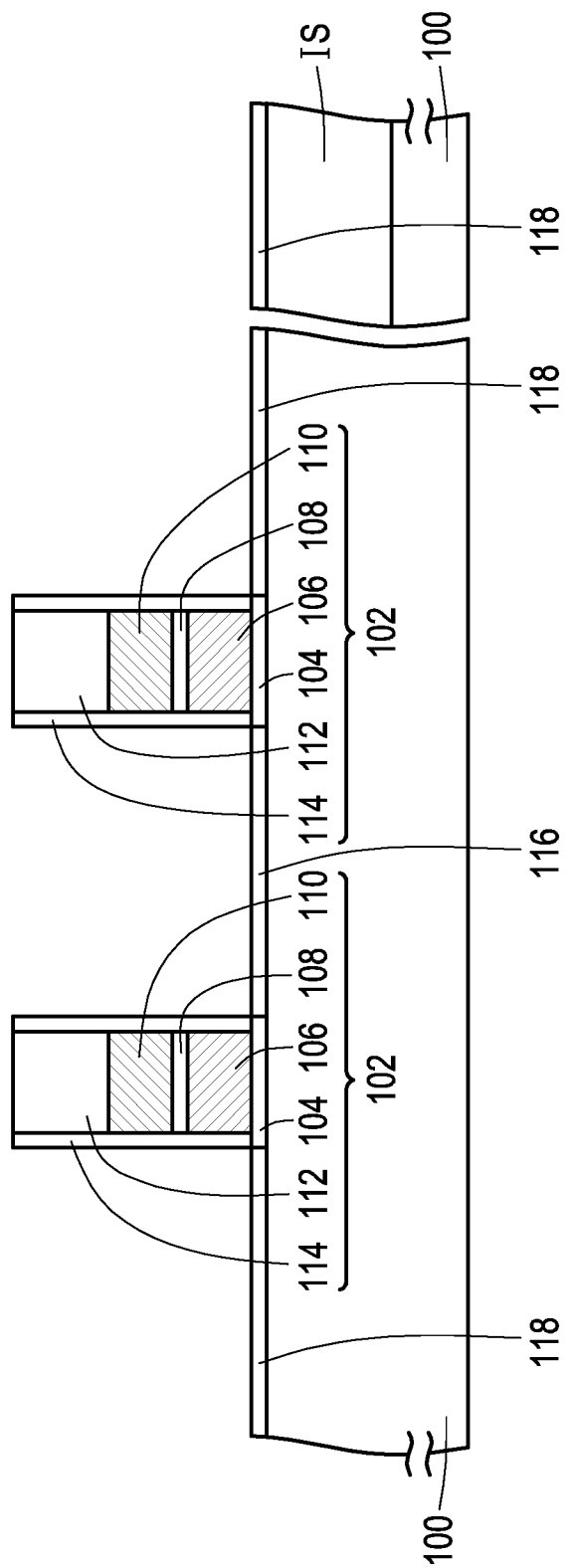
Figure 8B:
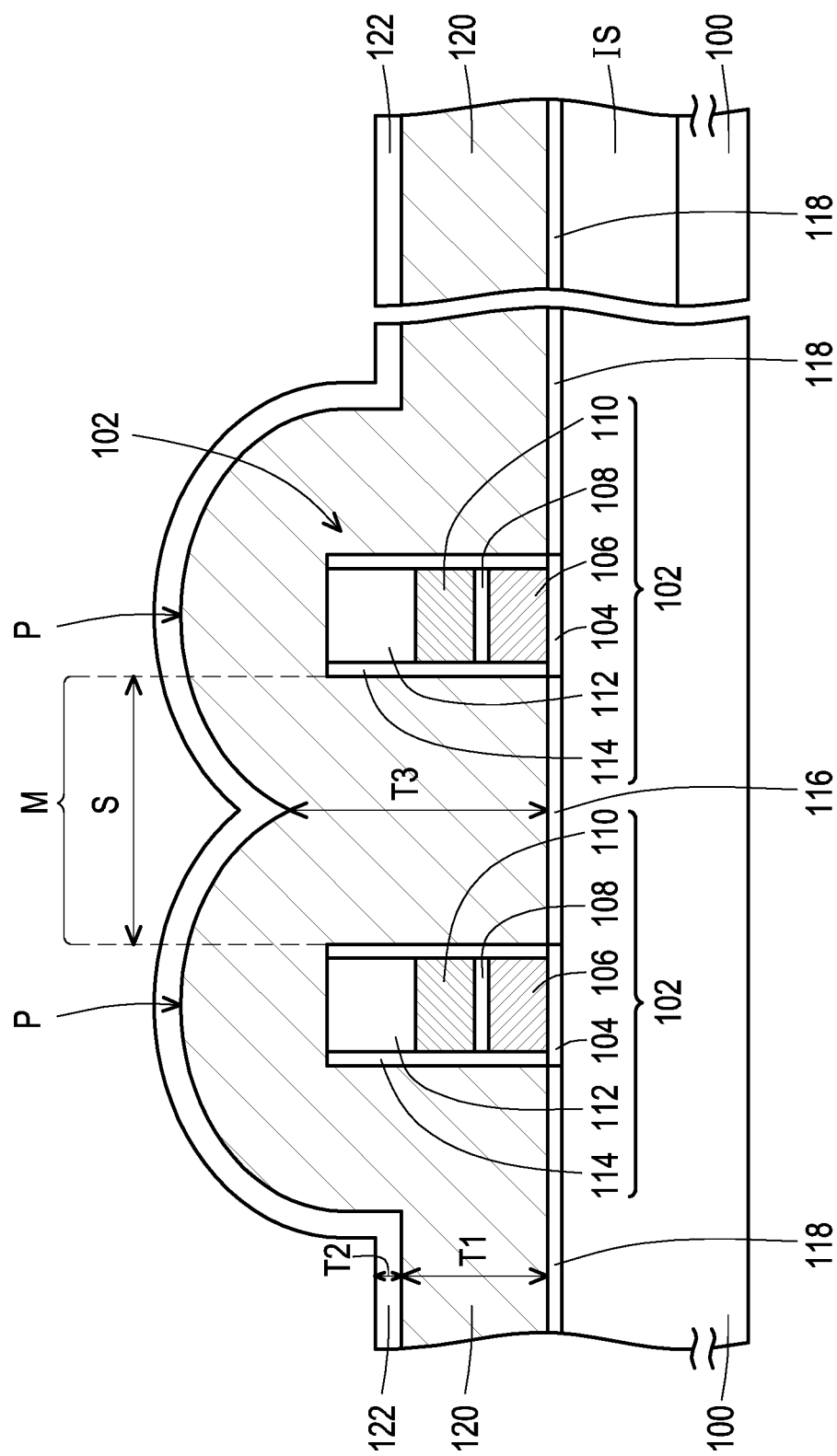
Figure 8C:
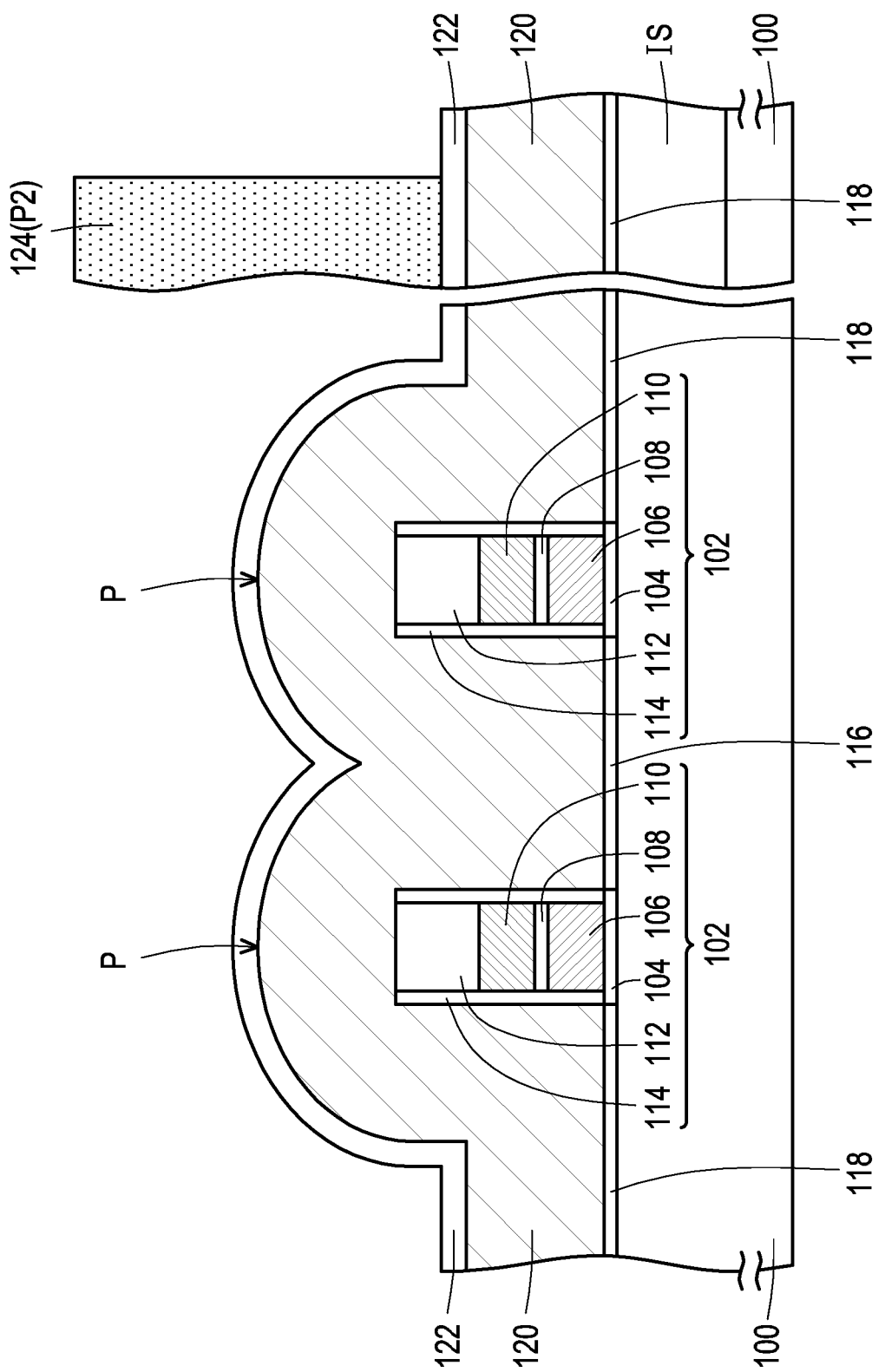
Figure 8D:
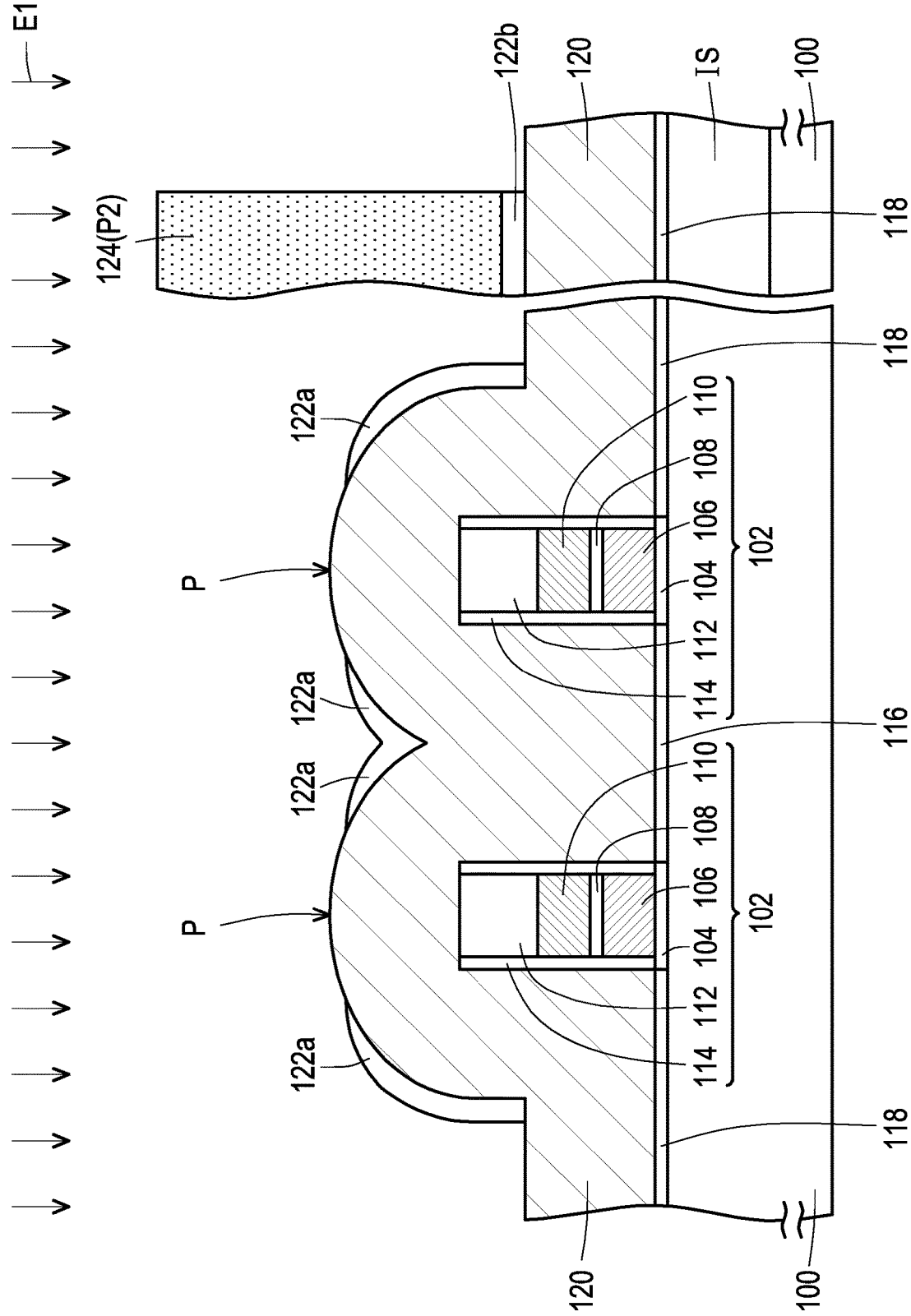
Figure 8E:
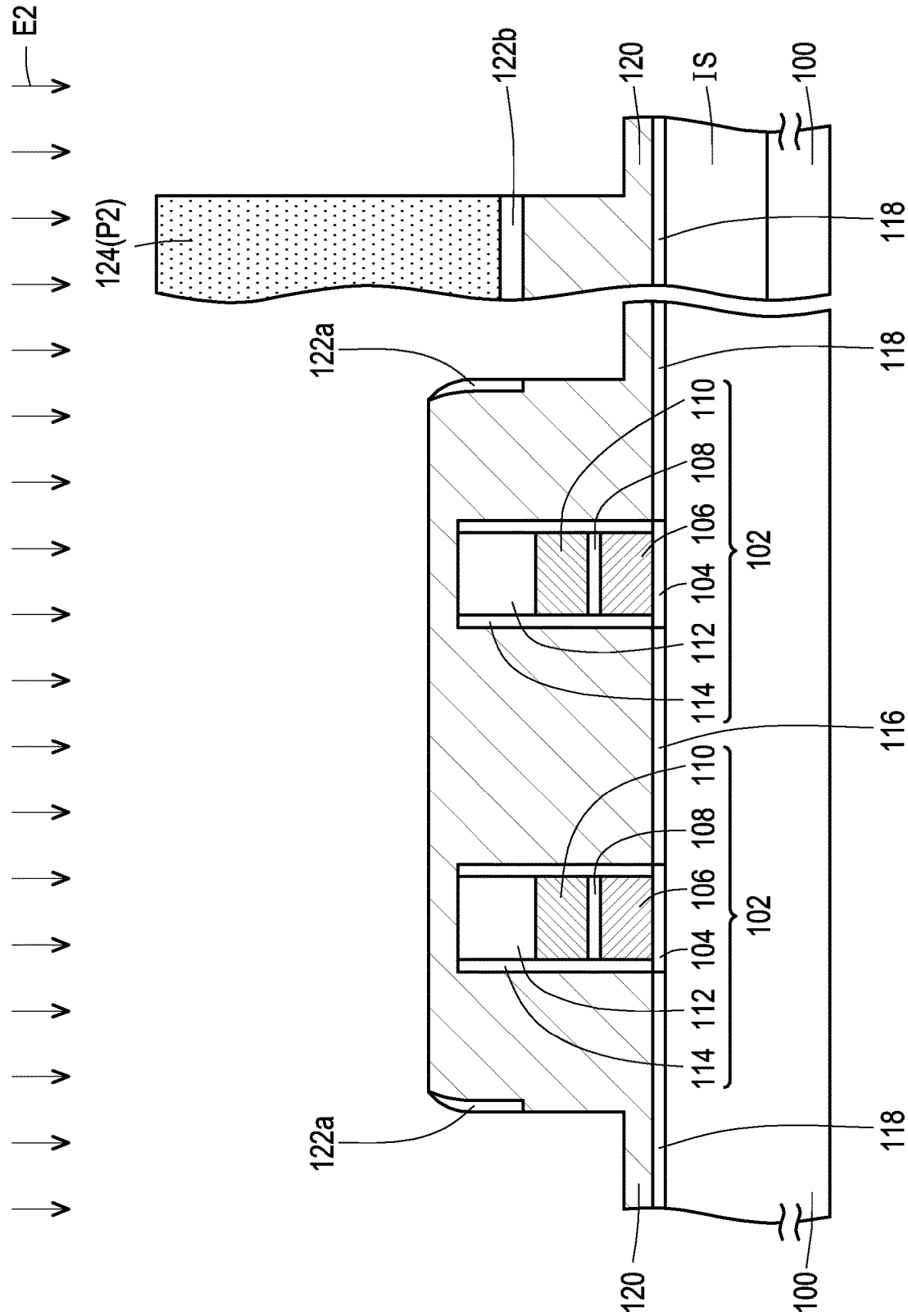
Figure 8G:
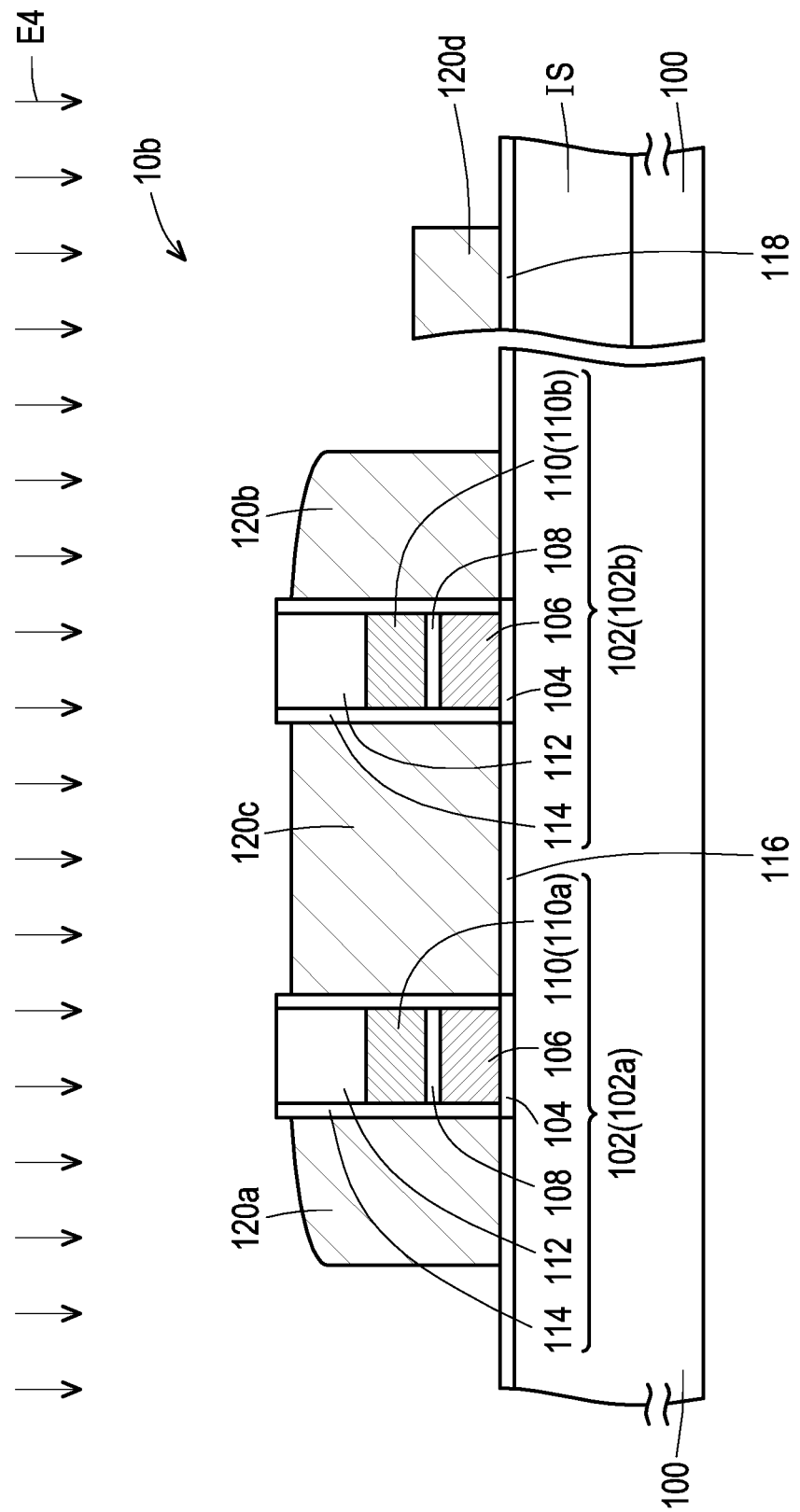

Referring to FIG. 1A to FIG. 1G and FIG. 8A to FIG. 8G, the difference between the manufacturing method of the memory structure 10b (FIG. 8G) and the manufacturing method of the memory structure 10a (FIG. 1G) is described as follows. In FIG. 8B, the thickness T1 of the conductive material layer 120 may be greater than or equal to half of the spacing S between the two gate stack structures 102, so that the two protrusions P are merged to form a merged portion M. The minimum thickness T3 of the merged portion M may be greater the thickness T1 of the conductive material layer 120. Therefore, in FIG. 8C to FIG. 8E, the portion P1 of the patterned photoresist layer 124 in FIG. 1C to FIG. 1E may be omitted. Moreover, the same or similar components in the embodiment of FIG. 8A to FIG. 8G and the embodiment FIG. 1A to FIG. 1G are denoted by the same symbols, the same or similar content in the embodiment of FIG. 8A to FIG. 8G and the embodiment FIG. 1A to FIG. 1G may be referred to the description of the embodiment FIG. 1A to FIG. 1G, and the description thereof is omitted.

In summary, the manufacturing method of the memory structure of the aforementioned embodiments can improve the electrical performance of the memory device and reduce the manufacturing cost.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A method of manufacturing a memory structure, comprising:
   providing a substrate;
   forming two gate stack structures on the substrate;
   conformally forming a conductive material layer on the two gate stack structures, wherein the conductive material layer comprises two protrusions located on the two gate stack structures;
   forming hard mask spacers on two sides of each of the two protrusions;
   performing a first etching process to remove a portion of the conductive material layer by using the hard mask spacers as a mask;
   performing a second etching process to completely remove the hard mask spacers; and
   after completely removing the hard mask spacers, performing a third etching process on the conductive material layer to form a first conductive spacer, a second conductive spacer, and a conductive layer, wherein
   the first conductive spacer and the second conductive spacer are located on one side and the other side of the two gate stack structures, and
   the conductive layer is located between the two gate stack structures.

2. The method of manufacturing the memory structure according to claim 1, wherein the hard mask spacers between the two protrusions are connected to each other.

3. The method of manufacturing the memory structure according to claim 1, wherein the first conductive spacer and the second conductive spacer are separated from the conductive layer.

4. The method of manufacturing the memory structure according to claim 1, wherein a method of forming the hard mask spacers comprises:
   conformally forming a hard mask material layer on the conductive material layer; and
   performing a fourth etching process on the hard mask material layer.

5. The method of manufacturing the memory structure according to claim 4, wherein the fourth etching process comprises a dry etching process.

6. The method of manufacturing the memory structure according to claim 4, wherein the method of forming hard mask spacers further comprises:
before performing the fourth etching process, forming a patterned photoresist layer on the hard mask material layer, wherein a first portion of the patterned photoresist layer covers a portion of the hard mask material layer between the two gate stack structures.

7. The method of manufacturing the memory structure according to claim 6, wherein the method of forming hard mask spacers further comprises:
before completely removing the hard mask spacers, removing the patterned photoresist layer.

8. The method of manufacturing the memory structure according to claim 6, wherein a second portion of the patterned photoresist layer covers a portion of the hard mask material layer outside the two gate stack structures.

9. The method of manufacturing the memory structure according to claim 8, wherein
after performing the third etching process on the conductive material layer, a portion of the conductive material layer below the second portion of the patterned photoresist layer is remained to form a pad, and the pad is connected to the second conductive spacer.

10. The method of manufacturing the memory structure according to claim 1, further comprising:
after performing the first etching process and before completely removing the hard mask spacers, performing a shape adjustment process, wherein the shape adjustment process comprises:
performing a fourth etching process on the hard mask spacers; and
after performing the fourth etching process, performing a fifth etching process on the conductive material layer by using the hard mask spacers as a mask.

11. The method of manufacturing the memory structure according to claim 1, wherein the first etching process comprises a dry etching process.

12. The method of manufacturing the memory structure according to claim 1, wherein the second etching process comprises a wet etching process, a dry etching process, or a combination thereof.

13. The method of manufacturing the memory structure according to claim 1, wherein the third etching process comprises a dry etching process.

14. The method of manufacturing the memory structure according to claim 1, wherein the conductive layer extends from a sidewall of one of the two gate stack structures to a sidewall of the other of the two gate stack structures.

15. The method of manufacturing the memory structure according to claim 1, wherein the conductive layer comprises:
a center portion; and
two side portions connected to two sides of the center portion, wherein a height of the center portion is lower than heights of the two side portions.

16. The method of manufacturing the memory structure according to claim 1, wherein each of the two gate stack structures comprises:
a first dielectric layer located on the substrate;
a charge storage layer located on the first dielectric layer;
a second dielectric layer located on the charge storage layer;
a gate located on the second dielectric layer
a hard mask layer located on the gate; and
a dielectric spacer located on a sidewall of the gate stack structure.

17. The method of manufacturing the memory structure according to claim 1, wherein one end of one of the two gate stack structures is connected to one end of the other of the two gate stack structures to form a U-shaped gate stack structure.

18. The method of manufacturing the memory structure according to claim 17, wherein one end of the first conductive spacer is connected to one end of the second conductive spacer to form a U-shaped conductive spacer.

19. The method of manufacturing the memory structure according to claim 1, wherein two ends of one of the two gate stack structures are connected to two ends of the other of the two gate stack structures to form a ring-shaped gate stack structure.

20. The method of manufacturing the memory structure according to claim 19, wherein
one end of the first conductive spacer is connected to one end of the second conductive spacer to form a U-shaped conductive spacer, or
two ends of the first conductive spacer are connected to two ends of the second conductive spacer to form a ring-shaped conductive spacer.

* * * * *